United States Patent

Takada et al.

[11] Patent Number: 5,224,021
[45] Date of Patent: Jun. 29, 1993

[54] SURFACE-MOUNT NETWORK DEVICE

[75] Inventors: Kinji Takada, Neyagawa; Kazuo Oishi, Sakai; Syozo Yamashita, Katano; Koji Nishida, Kawanishi, all of Japan

[73] Assignee: Matsushita Electric Industrial Co., Ltd., Osaka, Japan

[21] Appl. No.: 601,231

[22] Filed: Oct. 19, 1990

[30] Foreign Application Priority Data

Oct. 20, 1989 [JP] Japan .................. 1-274173
Nov. 16, 1989 [JP] Japan .................. 1-298240

[51] Int. Cl.⁵ .................. H05K 5/00; H01L 23/48; H01R 9/00
[52] U.S. Cl. .................. 361/406; 174/52.2; 174/52.3; 174/52.4; 257/692; 257/696; 257/787; 439/68; 439/83
[58] Field of Search .............. 361/392, 395, 396, 400, 361/404, 405, 417, 419, 420, 393, 397, 403, 406, 412, 413; 174/260, 50.54; 228/180.2; 439/65, 68, 82, 83, 876; 357/68, 70, 80

[56] References Cited

U.S. PATENT DOCUMENTS

| | | | |
|---|---|---|---|
| 3,417,193 | 12/1968 | Cole | 439/83 |
| 4,266,282 | 5/1981 | Henle et al. | 365/52 |
| 4,365,284 | 12/1982 | Tanaka | 361/395 |
| 4,743,868 | 1/1984 | Henle et al. | 361/398 |
| 4,568,796 | 12/1986 | Lebailly et al. | 361/395 |
| 4,586,764 | 5/1986 | Mullen, III et al. | 439/83 |
| 4,673,967 | 6/1987 | Hingorany | 361/405 X |
| 4,701,830 | 10/1987 | Kato et al. | 361/404 |
| 4,722,027 | 1/1988 | Hayakawa | 361/400 |
| 4,473,868 | 5/1988 | Katoh et al. | 361/400 X |
| 4,785,533 | 11/1988 | Seino et al. | 361/412 |
| 4,801,916 | 1/1989 | Kaindl et al. | 361/406 |
| 4,870,224 | 9/1989 | Smith et al. | 174/52.4 |
| 5,041,903 | 8/1991 | Millerick et al. | 357/80 |
| 5,043,791 | 8/1991 | Stokes et al. | 357/70 |

FOREIGN PATENT DOCUMENTS

| | | |
|---|---|---|
| 0263943 | 4/1988 | European Pat. Off. . |
| 2655841 | 6/1978 | Fed. Rep. of Germany . |
| 2719047 | 11/1978 | Fed. Rep. of Germany ...... 361/405 |
| 2820153 | 11/1979 | Fed. Rep. of Germany . |
| 3015466 | 10/1980 | Fed. Rep. of Germany . |
| 61-188302 | 11/1986 | Japan . |
| 0241358 | 10/1987 | Japan .................. 357/68 |
| 0249464 | 10/1987 | Japan .................. 357/68 |
| 63-41003 | 2/1988 | Japan . |
| 1161801 | 6/1989 | Japan . |
| 0279580 | 11/1989 | Japan .................. 439/83 |
| 0012781 | 1/1990 | Japan .................. 439/83 |
| 0027672 | 1/1990 | Japan .................. 439/83 |
| 0125489 | 5/1990 | Japan .................. 439/83 |
| 0210774 | 8/1990 | Japan .................. 439/68 |
| 8602230 | 4/1986 | World Int. Prop. O. .......... 361/412 |

OTHER PUBLICATIONS

K. Hermann et al, "Vertically Mounted Module," IBM Technical Disclosure Bulletin, vol. 27, No. 3, Aug. 1984. pp. 1599–1600.
EPO Search Report for Corresponding European application (90120119.4).

*Primary Examiner*—Leo P. Picard
*Assistant Examiner*—D. Sparks
*Attorney, Agent, or Firm*—Ratner & Prestia

[57] ABSTRACT

A surface-mount network device which is to be mounted on a mounting substrate is disclosed. This device has an insulating substrate having wirings and passive elements. A plurality of lead terminals sandwich the insulating substrate from an end face of the insulating substrate. Terminal connection conductors are formed on the main surfaces of the insulating substrate and connect the lead terminals and at least one of the wirings and the passive elements. Sealing material cover at least connecting portions between the terminal connection conductors and the lead terminals. End portions of the lead terminals are bent to extend in a direction substantially parallel to the mounting substrate. This device is to be mounted vertically on the mounting substrate through the bent end portions of the lead terminals.

10 Claims, 19 Drawing Sheets

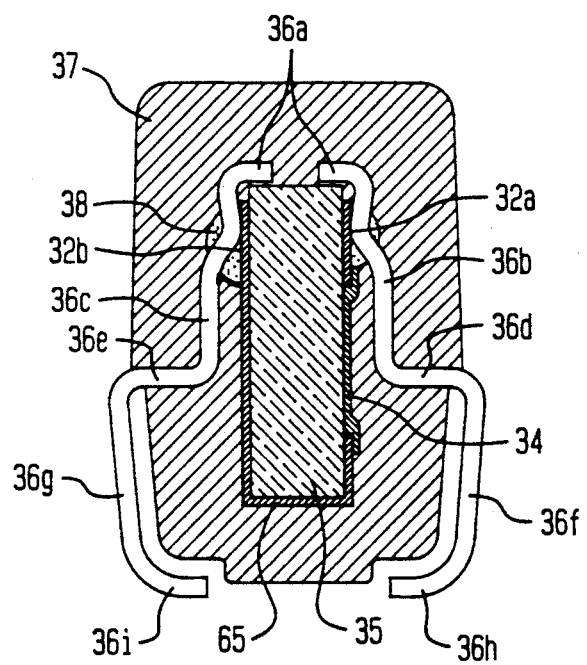

SURFACE-MOUNT NETWORK DEVICE

BACKGROUND OF THE INVENTION

1. Field of the Invention:

This invention relates to a surface-mount network device, and more particularly to a surface-mount electronic component having a plurality of lead terminals and capable of achieving a variety of composite circuits in one component.

2. Description of the Prior Art:

In recent years, with decreasing size of electronic apparatus, development of electronic components that contain a plurality of passive elements such as resistors, capacitors, coils, etc., in one package has been actively under way (such electronic components being hereinafter referred to as network devices). Network devices such as pull-up/pull-down resistor network devices extensively used in digital circuits, RC network devices for suppression of interface noise, and LCR network devices for filters have been making a great contribution to increasing the number of electronic components mounted on one printed circuit board and decreasing the number of packaging processes.

Network devices are used, for example, to provide interface passive element circuits for connection between integrated circuits (ICs) mounted on a printed circuit board (a mounting substrate). FIG. 1 shows an example of such an interface passive element circuit interconnecting two ICs. Block C illustrated in FIG. 1 shows a bussed circuit in which one end of each resistor R1 is connected in parallel to one of the 4-bit bus lines interconnecting the digital ICs while the other end thereof is connected to the power source Vcc. The circuit of block C constitutes a pull-up resistor circuit. Block A shows an isolated resistor network circuit in which one end of each resistor R2 is connected to one of the 4-bit parallel lines interconnecting the digital ICs while the other end thereof is connected in series to one of the 4-bit bus lines interconnecting the digital ICs. Block B shows a capacitor network for suppression of noise in which one of paired electrodes in each capacitor C1 is connected in parallel to one of the 4-bit bus lines interconnecting the digital ICs while the other electrode thereof is grounded.

FIG. 2 shows a prior art single in-line package (SIP) resistor network device which has been used in general purpose applications. The SIP type network device includes an alumina or ceramic insulating substrate 1 on which a circuit is formed, a plurality of lead terminals 5 each gripping the insulating substrate 1 from both sides, and a molding compound 7 encapsulating the insulating substrate 1. A wiring conductor 2, terminal conductors 3 and resistors 4 are disposed on the insulating substrate 1 to form a circuit thereon. The lead terminals 5 each have a clip portion 5a that grips the insulating substrate 1 from both sides, the clip portion 5a being both electrically and mechanically connected to the terminal conductor 3 on the insulating substrate 1 by soldering 6.

The SIP type resistor network device of the above construction is mounted on a printed circuit board in such a way that the insulating substrate 1 is positioned perpendicular to the main surface of the printed circuit board. The lead terminals 5 on the SIP type network device are inserted in through-holes provided in the printed circuit board. On the other hand, a dual in-line package (DIP) type network device is mounted on a printed circuit board in such a way that the insulating substrate contained therein is positioned parallel with the main surface of the printed circuit board. In other words, the DIP type network device is surface-mounted on the printed circuit board. Therefore, the SIP type network device has an advantage over the DIP type one in that the former takes a smaller space on the printed circuit board when mounted thereon. The SIP type network device has the further advantage that since its terminal pitch (lead terminal spacing) is made to match that of commonly used insert type (through-hole type) IC package connectors, it is compatible with the commonly used through-hole type IC packages. Also, since it has a single in-line input terminal configuration, the SIP type network device is best suited for achieving a passive element circuit connected in parallel to bus lines, such as shown in blocks B and C in FIG. 1.

In the SIP type network device, a variety of network circuits can be constructed, such as those shown in FIG. 3A to FIG. 3G, by combining various elements such as resistors and capacitors on the two main surfaces of the insulating substrate. Therefore, the SIP type network device is extensively used in digital interface applications.

However, with the progress of surface-mounting techniques, new IC packages having a smaller terminal pitch than 2.54 mm commonly used on the DIP type have come into use, such IC packages including SOP (small outline package), QFP (quad flat package), PLCC (plastic leaded chip-carrier), and LCC (leadless chip-carrier) types having terminal pitch of 1.27 mm, 1.0 mm, 0.8 mm, 0.65 mm and 0.5 mm, respectively.

On the other hand, the common terminal pitch of the SIP type network device is 2.54 mm or 1.78 mm. It should also be noted that it is extremely difficult to make smaller than 1.27 mm the through-hole pitch on a printed circuit board. This has therefore given rise to a problem in terms of compatibility with the above-mentioned new type IC packages. The SIP type network device is a through-hole type electronic component, but in recent years, increasing numbers of high packaging density printed circuit boards have come to be used on which only surface mountable electronic components are used, such components being surface-mounted on both sides of the printed circuit board. Surface-mount electronic components have therefore come to be used extensively. Of a plurality of electronic components mounted on one printed circuit board, if only SIP type network devices are inserted in through-holes of the printed circuit board while all other electronic components are surface-mounted, there will arise the problem of increased costs of the printed circuit board. This is a shortcoming of the insert type SIP type network device.

FIG. 4A is a plan view of a surface-mount network device in another prior art. FIG. 4B shows a cross section thereof. The network device illustrated is a SOP type resistor network device. As shown in FIG. 4A and FIG. 4B, a terminal conductor 11 and a resistor 12 are formed on an insulating substrate 10, the terminal conductor 11 being connected to a lead terminal 9 by soldering 13. The connection may sometimes be provided by wire bonding or other connecting methods. The insulating substrate 10 is encapsulated in a plastic mold 8. The plastic mold 8 is formed by transfer molding or injection molding. Using such molding methods to form the plastic mold 8 assures production of a package having a high dimensional accuracy and makes it easier to automatically mount network devices on a printed circuit board using a mounter.

The prior art SOP type resistor network device has a dual in-line configuration in which a plurality of lead terminals 9 extend outwardly from the longer sides of the insulating substrate 10, and is mounted on a printed circuit board in such a way that the main surface of the insulating substrate 10 is positioned parallel with the main surface of the printed circuit board. Therefore, this network device is suitable for the isolated resistor network device circuit of block A shown in FIG. 1. Also, in the above described construction of this network device, it is possible to reduce the terminal pitch to less than 1.27 mm.

However, the prior art SOP type network device involves difficulty when it comes to reducing the package width. This is because the main surface of the insulating substrate 10 is positioned parallel with the main surface of the printed circuit board. In the case of the prior art SOP type network device, it is not possible to reduce the package width to less than 3 mm.

If a pull-up circuit such as shown in block C in FIG. 1 is to be formed using a dual in-line SOP type network device, the SOP type network device will have a circuit shown in FIG. 4D. In order to mount a dual in-line SOP type network device having such a circuit, the printed circuit board will have a circuit configuration as shown in FIG. 5. There are mounted on the printed circuit board a digital IC 16, a SOP type resistor network device 14, and an I/O connector 17, an 8-bit bus 18 connecting the digital IC 16 to the SOP type resistor network device 14 and the SOP type resistor network device 14 to the I/O connector 17.

As is apparent from FIG. 5, the wiring pattern of the 8-bit bus lines 18 is complex and takes a large space on the printed circuit board, thus increasing the virtual area needed on the printed circuit board for mounting the network device.

FIG. 6A shows still another example of the prior art. The component shown is a surface-mount multiple chip resistor network device. Semicircular recesses are formed in side surfaces of an insulating substrate 19 along the longitudinal direction thereof, and thick film electrodes are formed on the upper surface of the substrate 19 as well as in the recesses in the side surfaces. The thick film electrodes function as output electrodes 20 for connecting the network device to wiring on an external printed circuit board. A resistor 21 is printed and baked between the output electrodes 20. FIG. 6B shows an equivalent circuit for the multiple chip resistor network device illustrated in FIG. 6A. The output electrodes 20 are connected directly to wiring on the printed circuit board by soldering. Therefore, if there is a difference in thermal expansion coefficient between the insulating substrate 19 and the printed circuit board, cracks are likely to be caused in the soldered connections.

Also, when forming a large number of elements (e.g., resistors) on the insulating substrate 19, it is necessary to extend the length of the insulating substrate 19. An extended length of the insulating substrate 19 will make the insulating substrate 19 more susceptible to breakage when the printed circuit is warped due to mechanical stress. Further, since the output electrodes 20 are soldered directly to the printed circuit board, there is a possibility that the electrodes may be damaged if soldering temperature is too high or soldering time is too long.

Thus, the multiple chip network device has the disadvantage that its soldered connections are less reliable and less resistance to mechanical stress. Also, the multiple chip type network device has a simple construction with a plurality of elements arrayed thereon and, usually, does not have internal wiring. Therefore, when using the multiple chip network device as the pull-up/pull-down resistor circuits illustrated in block C in FIG. 1 or as the noise suppression capacitor network illustrated in block B where common grounding is provided using the bus lines via capacitors, it becomes necessary to provide common connection wiring on the printed circuit board for Vcc, GND, etc. Also, a double-sided wiring technique or a multilayer wiring technique is required to process portions where the wiring lines cross each other. Using these techniques involves the problem of increased production costs of the printed circuit board because of the need for formation of through-holes and multilayer wiring.

SUMMARY OF THE INVENTION

The surface-mount network device of the invention which is to be mounted on a mounting substrate, which overcomes the above-discussed and numerous other disadvantages and deficiencies of the prior art, comprises: an insulating substrate having at least one of wirings and passive elements; a plurality of lead terminals which sandwich said insulating substrate from an end face of said insulating substrate; terminal connection conductors which are formed on the main surfaces of said insulating substrate, said terminal connection conductors connecting said lead terminals and at least one of said wirings and said passive elements; and sealing means for covering at least connecting portions between said terminal connection conductors and said lead terminals; wherein end portions of said lead terminals are bent to extend in a direction substantially parallel to said mounting substrate, and said device is to be mounted vertically on said mounting substrate through said bent end portions of said lead terminals.

In a preferred embodiment, said end face of said insulating substrate is at the opposite side from a mounting surface of said device.

In a preferred embodiment, said end face of said insulating substrate is at the side of a mounting surface of said device.

According to the invention, a surface-mount network device which is to be mounted on a mounting substrate is provided, said device comprising: an insulating substrate having at least one of wirings and passive elements; a plurality of lead terminals which sandwich said insulating substrate from an end face of said insulating substrate, said end face of said insulating substrate being at the opposite side from a mounting surface of said device; terminal connection conductors which are formed on the main surfaces of said insulating substrate, said terminal connection conductors connecting said lead terminals and at least one of said wirings and said passive elements; and sealing means for covering said insulating substrate and at least connecting portions between said terminal connection conductors and said lead terminals; wherein end portions of said lead terminals are bent to extend in a direction substantially parallel to said mounting substrate, and said device is to be mounted vertically on said mounting substrate through said bent end portions of said lead terminals.

According to the invention, a surface-mount network device which is to be mounted on a mounting substrate is provided, said device comprising: an insulating substrate having at least one of wirings and passive elements; a plurality of lead terminals which sandwich said insulating substrate from an end face of said insulating substrate, said end face of said insulating substrate being at the side of a mounting surface of said device; terminal connection conductors which are formed on the main surfaces of said insulating substrate, said terminal connection conductors connecting said lead terminals and at least one of said wirings and said passive elements; and sealing means for covering said insulating substrate and at least connecting portions between said terminal connection conductors and said lead terminals; wherein end portions of said lead terminals are bent to extend in the direction substantially parallel to said mounting substrate, and said device is to be mounted vertically on said mounting substrate through said bent end portions of said lead terminals.

In a preferred embodiment, each of said lead terminals has a substantially U-shaped portion which sandwiches said insulating substrate.

In a preferred embodiment, each of said lead terminals has two approximately L-shaped portions which sandwich said insulating substrate.

In a preferred embodiment, each of said end portions of said lead terminals is bent to form an L-shaped portion.

In a preferred embodiment, each of said end portions of said lead terminals is bent to form an gullwing-shaped portion.

In a preferred embodiment, each of said end portions of said lead terminals is bent to form a J-shaped portion.

Thus, the invention described herein makes possible the objectives of; (1) providing a surface-mount network device having a reduced terminal pitch and a reduced package size; (2) providing a surface-mount network device having a high reliability of soldering and high resistance to thermal and mechanical stresses after mounting on a printed circuit board; and (3) providing a surface-mount network device capable of achieving a variety of circuits and capable of simplifying the wiring layout on a printed circuit board, thus reducing the space taken by the wiring on the printed circuit board.

BRIEF DESCRIPTION OF THE DRAWINGS

This invention may be better understood and its numerous objects and advantages will become apparent to those skilled in the art by reference to the accompanying drawings as follows:

FIG. 16 is a cross sectional view of a third embodiment of the present invention.

DESCRIPTION OF THE PREFERRED EMBODIMENTS

Figure 10A:
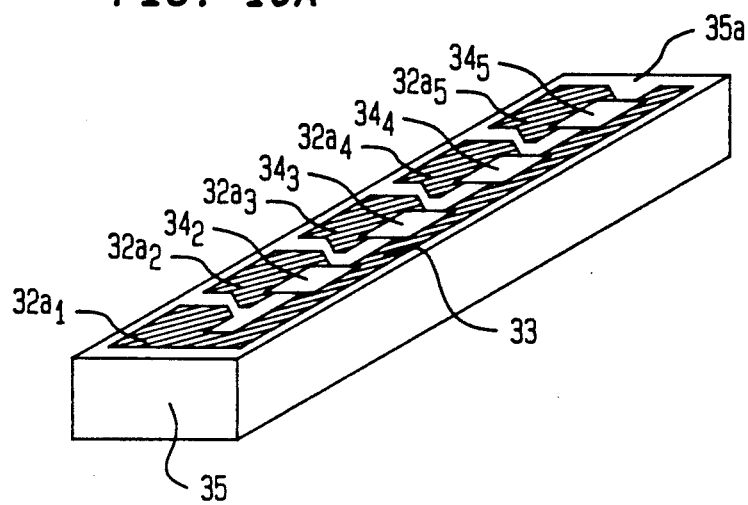
FIG. 10A is a perspective view showing a main surface of an insulating substrate of the first embodiment.
Figure 10B:
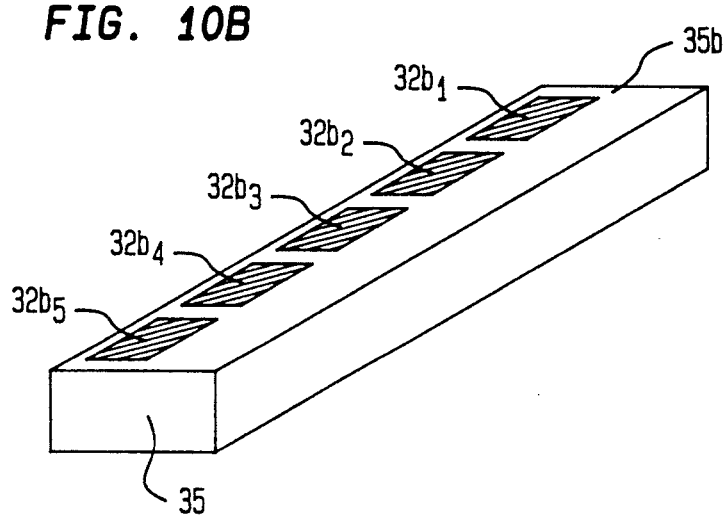
FIG. 10B is a perspective view showing another main surface of the insulating substrate of the first embodiment.

FIG. 10A shows a main surface $35a$ of an insulating substrate 35 of a surface-mount network device in a first embodiment of the present invention, the other main surface thereof being indicated at $35b$ in FIG. 10B. As shown in FIG. 10A, there are formed on the main surface $35a$ of the insulating substrate 35 a circuit comprising resistors $34_2$, $34_3$, $34_4$ and $34_5$, and wiring 33, and terminal connection conductors $32a_1$, $32a_2$, $32a_3$, $32a_4$ and $32a_5$ for connecting the circuit to lead terminals.

FIG. 10B shows the other main surface $35b$ of the insulating substrate 35. As shown in FIG. 10B, no circuits are formed on the main surface $35b$, but there are formed thereon terminal connection conductors $32b_1$–$32b_5$ similar to the terminal connection conductors $32a_1$–$32a_5$ formed on the main surface $35a$.

The circuit formed on the main surface $35a$ of the insulating substrate 35 of this embodiment is a parallel resistor network circuit having a common terminal connection conductor $32a_1$ connected to the four resistors $34_2$, $34_3$, $34_4$ and $34_5$, and having the four terminal connection conductors $32a_2$, $32a_3$, $32a_4$ and $32a_5$ respectively connected to the resistors $34_2$, $34_3$, $34_4$ and $34_5$. This circuit achieves, for example, the circuit shown in block C in FIG. 1.

Figure 10C:
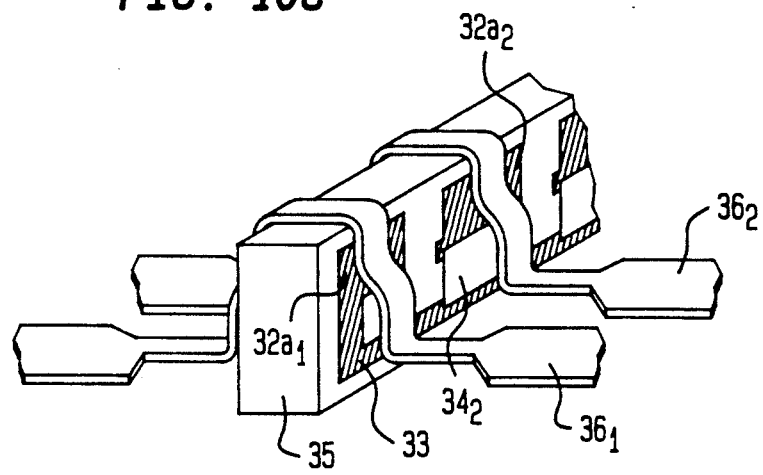
FIG. 10C is a perspective view showing lead terminals while being attached to the insulating substrate of the first embodiment.

FIG. 10C shows lead terminals 36 while being attached to the insulating substrate 35. In this embodiment, five lead terminals $36_1$–$36_5$ are provided. In this specification, the lead terminals $36_1$–$36_5$ are collectively referred to as the lead terminals 36 where necessary for the sake of simplification. Subscripts may also be omitted from other reference numerals when making collective reference. Each of the lead terminals 36 is bent in such a way as to grip the insulating substrate 35 with portions of the lead terminal 36 contacting the terminal connection conductors $32a$ and $32b$.

Figure 8:
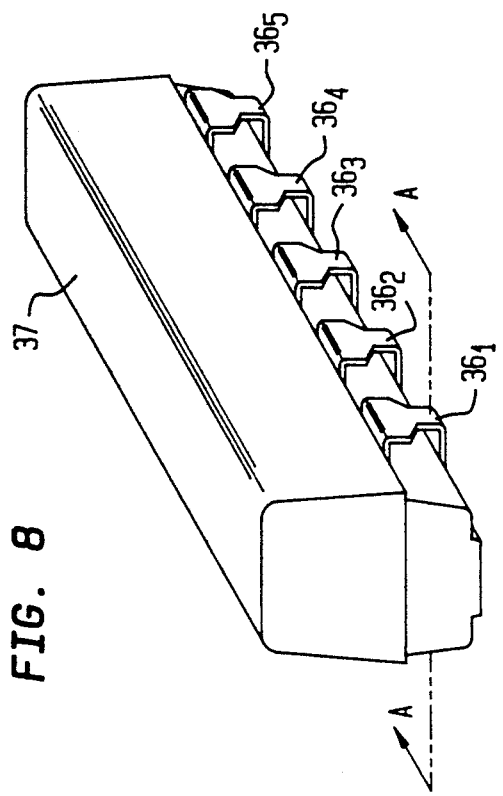
FIG. 8 is a perspective view showing the external appearance of the first embodiment.
Figure 7:
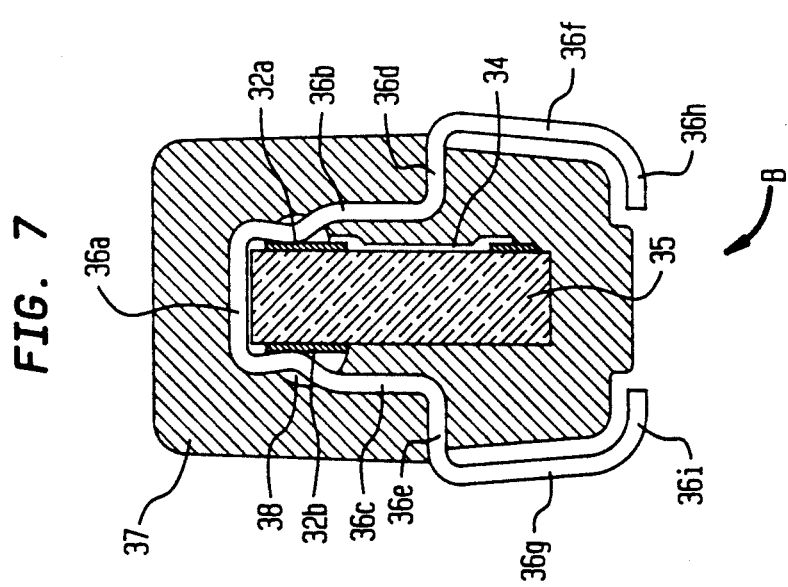
FIG. 7 is a cross sectional view of a first embodiment of the present invention.

FIG. 8 shows the external appearance of the surface-mount network device of this embodiment. As shown in FIG. 8, the insulating substrate 35 is completely encapsulated in the molding compound (sealing material) 37. FIG. 7 is a cross section taken along the line A—A of FIG. 8. The lead terminal 36 grips the insulating substrate 35 and is connected to the circuits formed on the main surfaces $35a$ and $35b$ of the insulating substrate 35 via the terminal connection conductors $32a$ and $32b$. The terminal connection conductors $32a$ and $36b$ are connected to the lead terminal 36 by high temperature solder 38.

Circuit elements on the insulating substrate 35 and connections between the lead terminals 36 and the insulating substrate 35 are encapsulated in the molding compound 37. End portions of each of the lead terminals 36 extend outside the molding compound 37, the extending portions being connected to wiring on a printed circuit board. The surface-mount network device of this embodiment is mounted on a printed circuit board in such a way that the surface thereof indicated by the arrow B in FIG. 7 faces the printed circuit board. That is, the surface of the surface-mount network device indicated by the arrow B in FIG. 7 is the mounting surface. Thus, the network device of this embodiment is mounted so that the main surfaces $35a$ and $35b$ of the insulating substrate 35 are positioned perpendicular to the main surface of the printed circuit board (i.e., vertical mounting), thus reducing the space on the printed circuit board taken by the network device.

To describe the shape of the lead terminal 36 in more detail, each of the lead terminals 36 comprise: a first portion $36a$ extending along an end face of the insulating substrate 35, the end face being at the opposite side from the mounting surface of the network device; two second portions $36b$ and $36c$ each extending from each end of the first portion $36a$ toward the mounting surface; two third portions $36d$ and $36e$ each extending from the end of each of the second portions $36b$ and $36c$ departing from the main surfaces $35a$ and $35b$ of the insulating substrate 35; two fourth portions $36f$ and $36g$ each extending from the end of the third portions $36d$ and $36e$ toward the mounting surface; and two fifth portions $36h$ and $36i$ each extending from the end of the fourth portions $36f$ and $36g$ in directions substantially perpendicular to the main surfaces $35a$ and $35b$ of the insulating substrate 35 (in directions substantially parallel to the main surface of the printed circuit board). In other words, each of the lead terminals 36 sandwiches the insulating substrate 35 from the end face of the insulating substrate 35. Each of the end portions of the lead terminals 36 is bent to extend in a direction substantially parallel to the printed circuit board, and to form L-shaped portion.

The network device of this embodiment is surface-mounted on a printed circuit board in such a way that the fourth portions $36f$ and $36g$ and the fifth portions $36h$ and $36i$ of the lead terminal 36 are connected to wiring on the printed circuit board.

With the above described construction in which the fourth portions $36f$ and $36g$ the fifth portions $36h$ and $36i$ of the lead terminal 36 are electrically interconnected within the network device, the network device of this embodiment achieves functions equivalent to those of a single in-line network device.

Since the lead terminals 36 are spaced from circuit elements, etc., on the insulating substrate 35 except those portions thereof contacting the terminal connection conductor $32a$ and $32b$ on the insulating substrate 35, conductors on the insulating substrate 35 can be easily wired in such a way as to cross the lead terminals 36 at different levels. Therefore, crossing of wiring lines in block C of FIG. 1 can be achieved within the network device without the need for crossing the wiring lines on the printed circuit board. When crossing of wiring lines is thus achieved within the network device, there is no need for the printed circuit board to be provided with through-holes or multilayer wiring.

Since the surface-mount network device of this embodiment is provided with lead terminals having the above described construction, if displacement occurs in the connections between the printed circuit board and the lead terminals 36 as a result of contraction or warpage of the printed circuit board, the lead terminals 36 having a bent shape described above serve to alleviate the stress resulting from the displacement, thus enhancing the reliability of the soldered connections.

Figure 9:
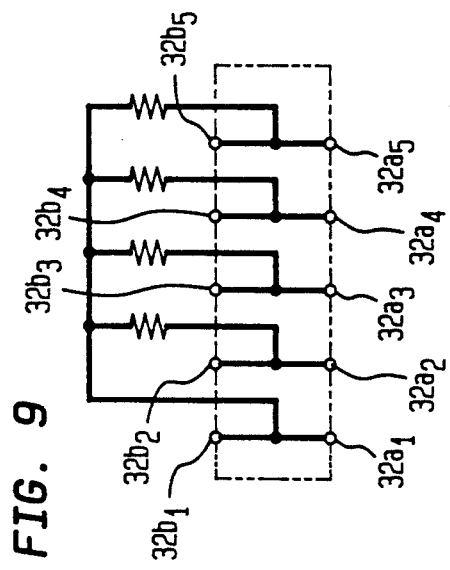
FIG. 9 is a circuit diagram showing an equivalent circuit for the first embodiment.

FIG. 9 shows an equivalent circuit for the surface-mount network device of this embodiment. The circuit shown is a parallel resistor network circuit. In the network device of this embodiment, the terminal conductors $32a_i$ ($i = 2, 3, 4$ and $5$) are respectively connected to the terminal conductors $32b_i$ via the lead terminals $36_i$ within the network device to achieve a circuit equivalent to that of a SIP type network device. The lead terminal $36_1$ connecting the terminal conductor $32a_1$ and the terminal conductor $32b_1$ functions as a common terminal of the parallel resistor network circuit.

Figure 11:
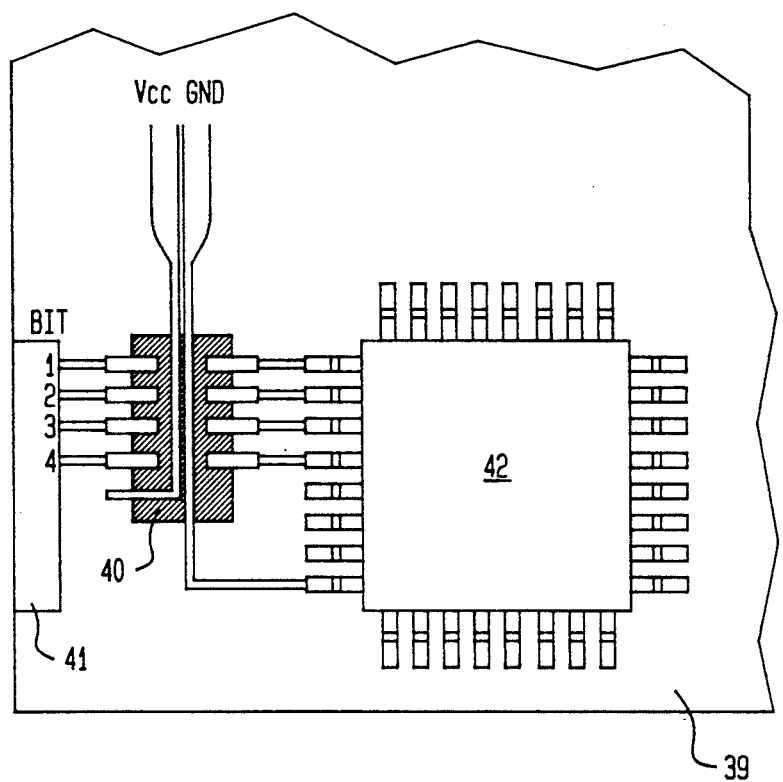
FIG. 11 is a plan view of a printed circuit board on which the first embodiment is mounted.

FIG. 11 shows a portion of a printed circuit board 39 on which the surface-mount network device 40 of this embodiment is mounted. Along with the surface-mount network device 40 of this embodiment, there are mounted on the printed circuit board 39 a surface-mount I/O connector 41 and digital IC 42. These surface-mount components are interconnected electrically via wirings on the printed circuit board 39. The surface-mount network device 40 of this embodiment has a terminal pitch small enough to match that of the surface-mount I/O connector 41 and digital IC 42, thus reducing the space taken by the wirings on the printed circuit board 39.

The insulating substrate 35 of this embodiment is formed from inorganic ceramic consisting of 96% alumina. The terminal connection conductors 32a and 32b are preferably formed on the insulating substrate 35 from thick film conductor paste of Ag, AgPd, Cu, Au or other materials. The conductor paste of these materials is deposited directly on the insulating substrate by screen printing technique and then baked at temperatures of 800° C. to 950° C. to form the terminal connection conductors. Air or nitrogen is used as the baking atmosphere. The resistors 34 are formed by baking $RuO_2$ base resistor paste at temperatures of 800° C. to 950° C. Thick film paste capable of being baked in nitrogen atmosphere may be used instead of the $RuO_2$ base resistor paste. The terminal connection conductors 32a and 32b and the resistor 34 may be formed by a thin film deposition technique.

A copper base, phosphor bronze base alloy metal or an iron-nickel alloy metal is desirable as the material for the lead terminals 36. As the lead terminals 36, a leadframe is used which is formed by rolling, hoop-cutting, or punching these materials. The leadframe should preferably be plated with solder on top of its plated surface. The terminal connection conductors 32a and 32b and the lead terminals 36 are interconnected mechanically and electrically by the high temperature solder 38.

Figure 12A:
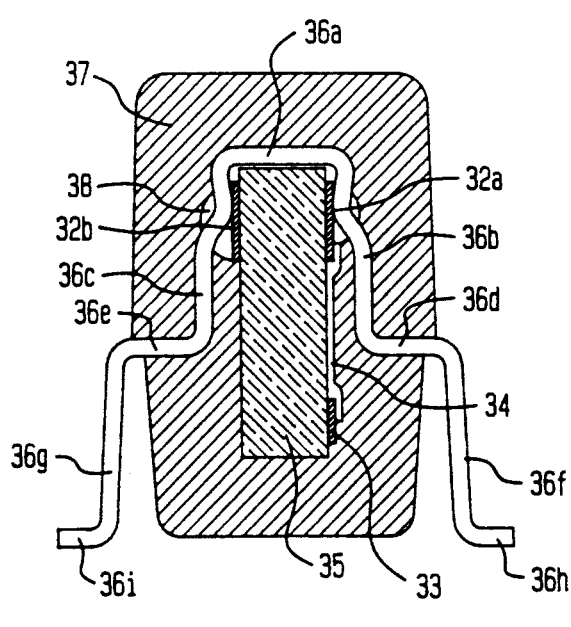
FIG. 12A is a cross sectional view illustrating another mode of the first embodiment.
Figure 12B:
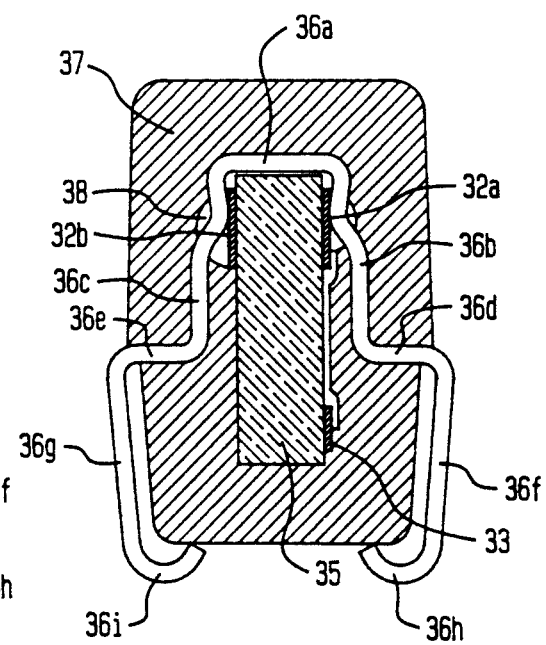
FIG. 12B is a cross sectional view illustrating a further mode of the first embodiment.

In the above embodiment, the surface-mount network device is provided with the lead terminals 36 the fifth portions 36h and 36i of which extend inwardly (toward the main surface sides), but alternatively, the lead terminals 36 may be formed with the fifth portions 36h and 36i extending outwardly (departing from the main surface sides), as shown in FIG. 12A. Also, the fifth portions 36h and 36i of the lead terminal 36 do not necessarily have to be formed in a straight shape, but may be formed in a curved shape as shown in FIG. 12B.

The fourth portions 36f and 36g and the fifth portions 36h and 36i of the lead terminal 36 are hereinafter collectively referred to as the outer lead portions. The outer lead portions of the lead terminal 36 of FIG. 7 have an L-shaped form, while those of the lead terminal 36 of FIG. 12A are formed in a gullwing-like shape and those illustrated in FIG. 12B in a J-like shape. Those shapes are easily formed by bending the end portions of the lead terminals 36.

Figure 12C:
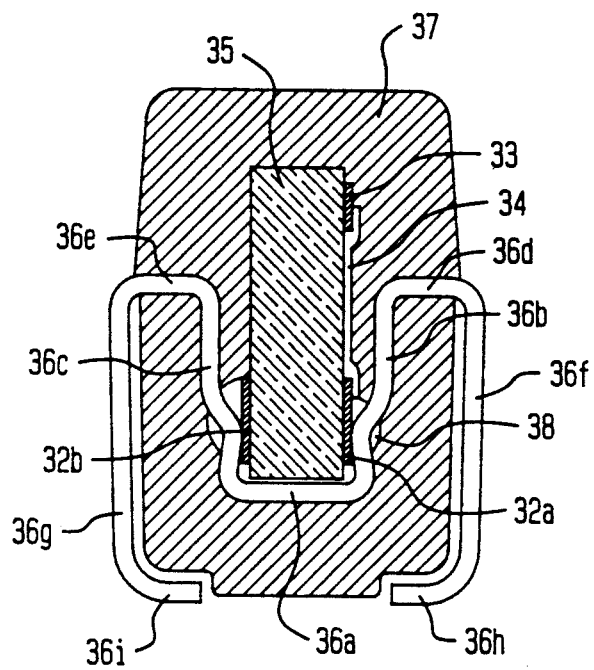
FIG. 12C is a cross sectional view illustrating yet another mode of the first embodiment.

In the surface-mount network device of this embodiment, the first portion 36a of the lead terminal 36 extends along an end face of the insulating substrate 35, the end face being at the opposite side from the mounting surface thereof, while the second portions 36b and 36c respectively extend from the ends of the first portion 36a toward the mounting surface. However, the surface-mount network device does not necessarily have to be provided with such construction, but instead, may be so constructed, as shown in FIG. 12C, that the first portion 36a of the lead terminal 36 extends along an end face of the insulating substrate 35, the end face being at the mounting surface side, while the second portions 36b and 36c respectively extend from the ends of the first portion 36a toward the opposite end face of the insulating substrate.

Figure 12D:
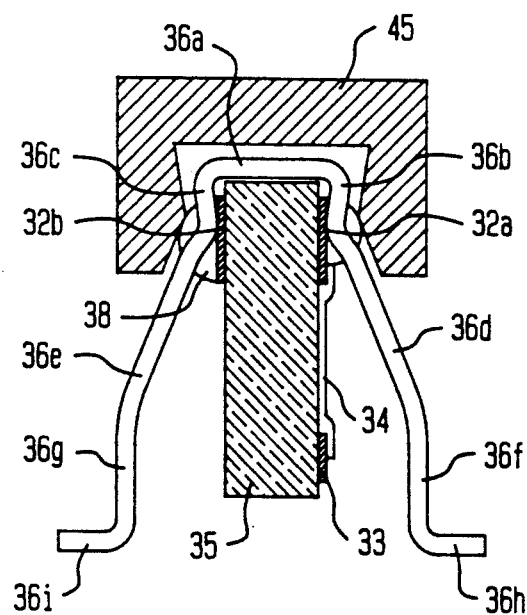
FIG. 12D is a cross sectional view illustrating a still further mode of the first embodiment.

Also, the insulating substrate 35 does not necessarily have to be completely encapsulated in the molding compound 37, but may be provided, as shown in FIG. 12D, with a cap 45 on the opposite side from the mounting side thereof. With such construction, since the top surface of the network device is sufficiently flattened, it is easy to automatically mount the network device on a printed circuit board using a mounter.

Figure 15A:
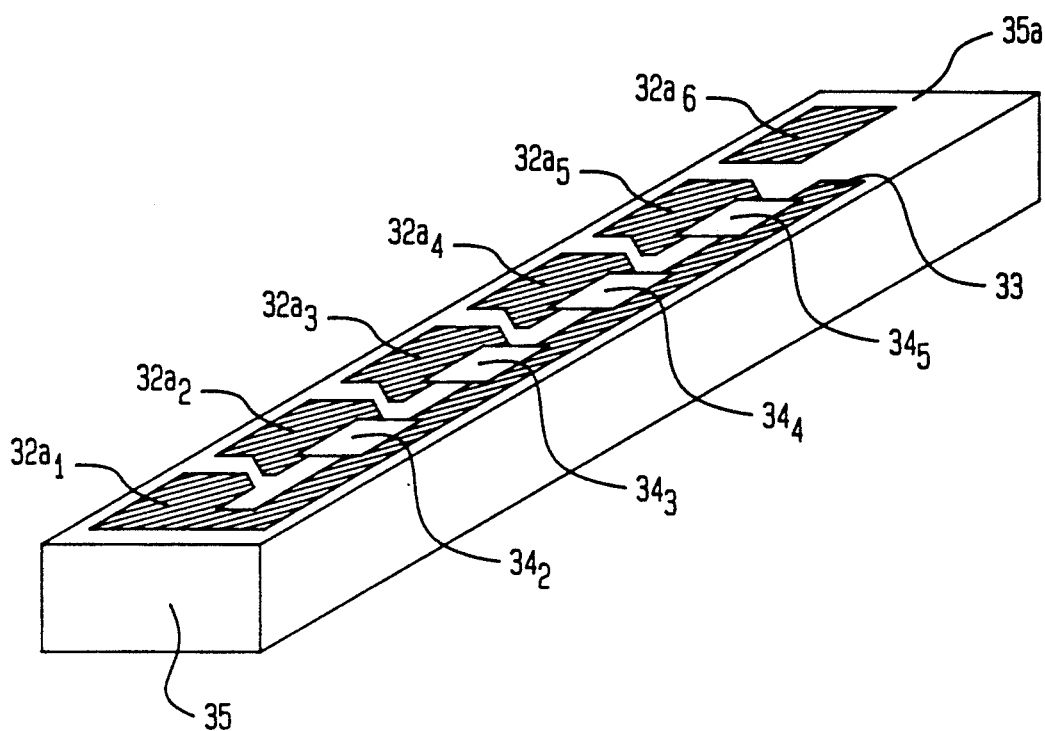
FIG. 15A is a perspective view showing a main surface of an insulating substrate of the second embodiment.

We will now describe a second embodiment of the invention. FIG. 15A shows a main surface 35a of an insulating substrate 35 of a surface-mount network device in the second embodiment, the other main surface thereof being indicated at 35b in FIG. 15B. As shown in FIG. 15A, there are formed on the main surface 35a of the insulating substrate 35 a circuit comprising resistors $34_2$, $34_3$, $34_4$, $34_5$, and $34_6$, and wiring 33, and terminal conductors $32a_1$, $32a_2$, $32a_3$, $32a_4$, $32a_5$ and $32a_6$ for connecting the circuit to lead terminals 36.

Figure 15B:
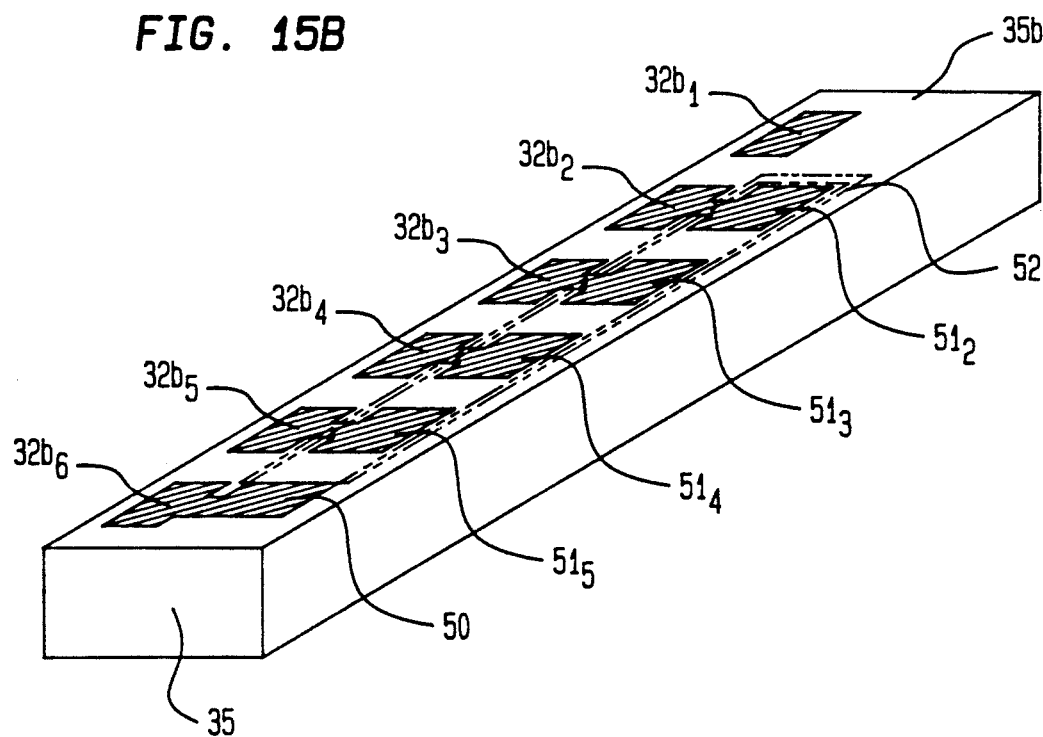
FIG. 15B is a perspective view showing another main surface of the insulating substrate of the second embodiment.

FIG. 15B shows the other main surface 35b of the insulating substrate 35. As shown in FIG. 15B, there are formed on the main surface 35b a circuit comprising a capacitor's lower conductor 50, a capacitor's dielectric 52, capacitor's upper conductors $51_2$–$51_6$, and terminal connection conductors $32b_1$, $32b_2$, $32b_3$, $32b_4$, $32b_5$ and $32b_6$ for connecting the circuit to the lead terminals 36. The capacitor's lower conductor 50, the capacitor's dielectric 52, and the capacitor's upper conductors $51_2$–$51_6$ are laminated in this order on the insulating substrate 35 to form capacitors.

Figure 13:
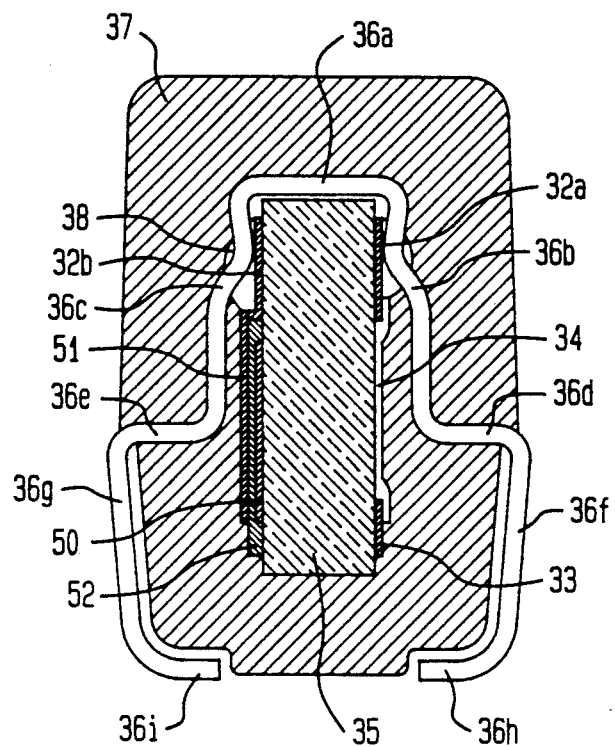
FIG. 13 is a cross sectional view of a second embodiment.
Figure 14:
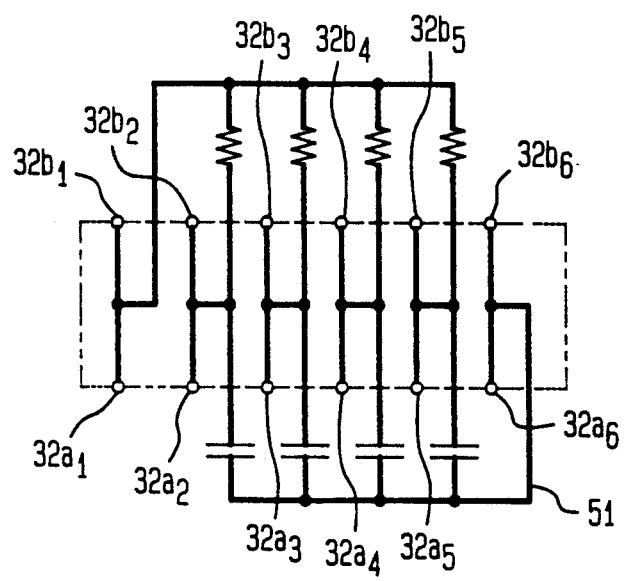
FIG. 14 is a circuit diagram showing an equivalent circuit for the second embodiment.

FIG. 13 shows a cross section of the surface-mount network device of this embodiment. The cross sectional structure of this embodiment is essentially the same as that of the foregoing embodiment except that capacitors are formed on the main surfaces 35b of the insulating substrate 35 of this embodiment. The circuits respectively formed on the main surfaces 35a and 35b are interconnected electrically by means of the lead terminals 36 or more specifically, by means of the first portion 36a and second portions 36b and 36c of each lead terminal 36, thus achieving an RC composite network device circuit in one electronic component. This RC composite network device circuit achieves, for example, a circuit integrally combining block B and block C of the circuit illustrated in FIG. 1. FIG. 14 shows an equivalent circuit for the network device of this embodiment.

In this embodiment, the lead terminal $36_1$ connected to the terminal connection conductors $32a_1$ and $32b_1$ functions as a common terminal of a parallel resistor network circuit in the RC composite network circuit. The lead terminal $36_6$ connected to the terminal connection conductors $32a_6$ and $32b_6$ functions as a common terminal of a parallel capacitance network circuit in the RC composite network circuit.

In this embodiment also, since the network device is mounted so that the main surface 35a and 35b of the insulating substrate 35 are positioned perpendicular to the main surface of a printed circuit board (i.e., vertical mounting), the space taken on the printed circuit board by the network device is reduced. Also, if displacement occurs in the connections between the printed circuit board and the lead terminals 36 as a result of contraction or warpage of the printed circuit board, the relatively long lead terminals 36 having a bent shape serve to alleviate the stress resulting from the displacement, thus enhancing the reliability of the soldered connections.

The materials, manufacturing method, etc., for the insulating substrate 35, resistors 34, lead terminals 36, etc., are the same as those for the first embodiment. The capacitor's conductors are formed in the same manner as the terminal connection conductors 32a and 32b. The capacitor's dielectric is formed by baking thick film paste of $TiO_2$, $BaTiO_3$, or $PbTiO_3$ base materials in an air or nitrogen atmosphere.

In this embodiment also, the lead terminals 36 may have the outer lead portions formed as shown in FIG. 12A, FIG. 12B, FIG. 12C or FIG. 12D.

Figure 19A:
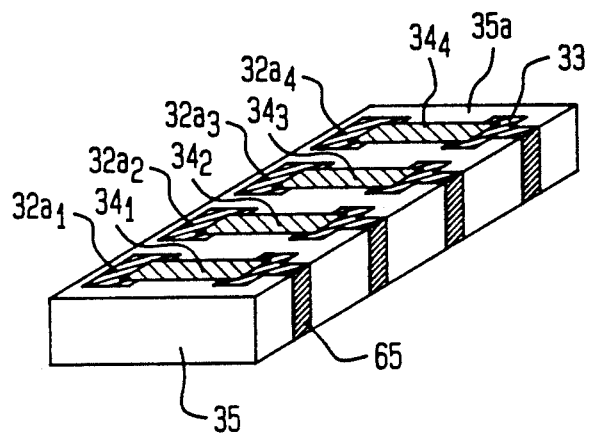
FIG. 19A is a perspective view showing a main surface of an insulating substrate of the third embodiment.

We will now describe a third embodiment of the invention. FIG. 19A shows a main surface 35a of an insulating substrate 35 of a surface-mount network device in the third embodiment of the present invention, the other main surface thereof being indicated at 35b in FIG. 19B. As shown in FIG. 19A, there are formed on the main surface 35a of the insulating substrate 35 a circuit comprising resistors $34_1$, $34_2$, $34_3$ and $34_4$, wirings (conductor lines) 33, and terminal connection conductors $32a_1$, $32a_2$, $32a_3$ and $32a_4$ for connecting the circuit to lead terminals 36. Wirings 65 are formed on an end face of the insulating substrate 35. The wirings 65 connect the circuit elements formed on the main surface 35a to circuit elements formed on the other main surface 35b.

Figure 19B:
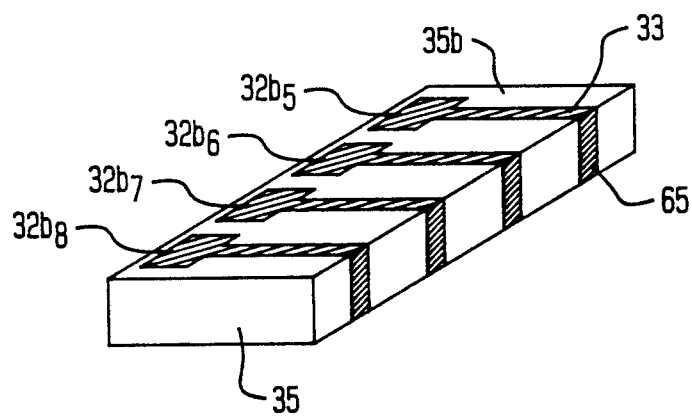
FIG. 19B is a perspective view showing another main surface of the insulating substrate of the third embodiment.

FIG. 19B shows the other main surface 35b of the insulating substrate 35. As shown in FIG. 19B, there are formed on the main surface 35b four terminal connection conductors $32b_5$, $32b_6$, $32b_7$ and $32b_8$ respectively connected to the resistors $34_1$, $34_2$, $34_3$ and $34_4$ formed on the main surface 35a. The electrical connections are provided by conductor lines (wirings) 33 formed on the main surfaces 35a and 35b of the insulating substrate 35 and the wirings 65 formed on the side face of the insulating substrate 35.

FIG. 16 shows a cross section of the surface-mount network device of this embodiment. The sectional structure of this embodiment is essentially the same as that of the first embodiment except that the first portion 36a of the lead terminal 36 is separated into two pieces insulated from each other. The piece of the first portion 36a and the second portion 36b or 36c of each of the lead terminals 36 constitute L-shaped portions which sandwich the insulating substrate 35.

Figure 18:
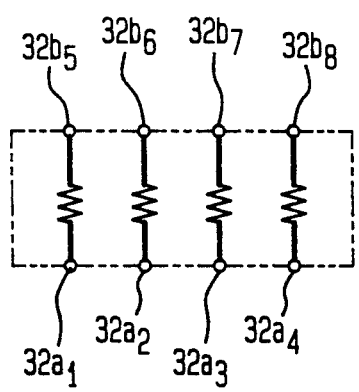
FIG. 18 is a circuit diagram showing an equivalent circuit for the third embodiment.

Because of this separation of the terminal lead 36, the respective circuits formed on the main surfaces 35a and 35b of the insulating substrate 35 are not connected directly by the lead terminal 36, but by the wirings 33 and 65, thus forming an isolated resistor network device circuit. This isolated resistor network device circuit achieves, for example, block A of the circuit illustrated in FIG. 1. FIG. 18 shows an equivalent circuit for the surface-mount network device of this embodiment. As shown, a dual in-line network device is achieved by electrically separating portions of the first portion 36a of the lead terminal 36.

Figure 17:
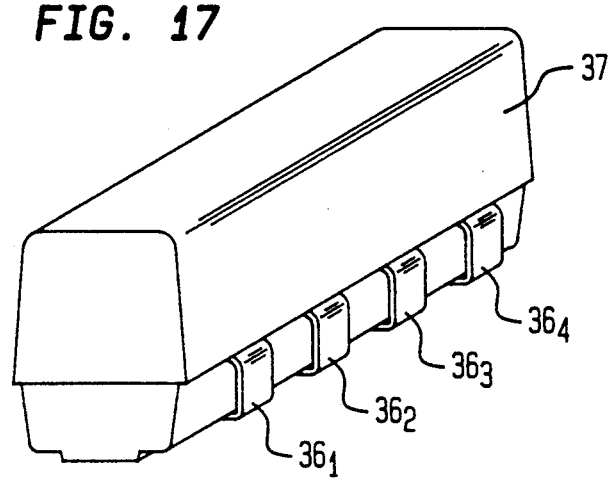
FIG. 17 is a perspective view showing the external appearance of the third embodiment.

FIG. 17 shows an external view of the surface-mount network device of this embodiment. The network device has an 8-pin dual in-line package. When the thickness of the insulating substrate is 0.8 mm, the package size can be reduced to approximately 1.8–2.5 mm. In that case, the space taken by the network device of this embodiment is reduced by more than 50% as compared with a conventional SOP type network device.

The materials, manufacturing method, etc., for the insulating substrate 35, resistors 34, lead terminals 36, wirings 33, etc., are the same as those for the first embodiment. The conductor lines 65 for interconnecting the circuits respectively formed on the main surface 35a and 35b of the insulating substrate 35 should preferably be formed on the insulating substrate 35 from low temperature baking conductor paste composed of such materials as Ag, AgPd, Cu, Au, etc., The conductor paste of these materials is deposited directly on the insulating subtrate 35 by a stamping method and then baked at a temperature lower than about 650° C. to form the conductor lines 65. Air or nitrogen is used as the baking atmosphere. In this embodiment, the conductor lines 65 are formed integrally with the terminal connection conductors 32b. The conductor lines 65 are formed also on one side face of the insulating substrate 35, to interconnect the circuits respectively formed on the main surfaces 35a and 35 b, but alternatively, an insulating substrate having a plurality of through-holes may be used and the conductor lines 65 may be formed within the through-holes by through-hole printing.

Figure 20A:
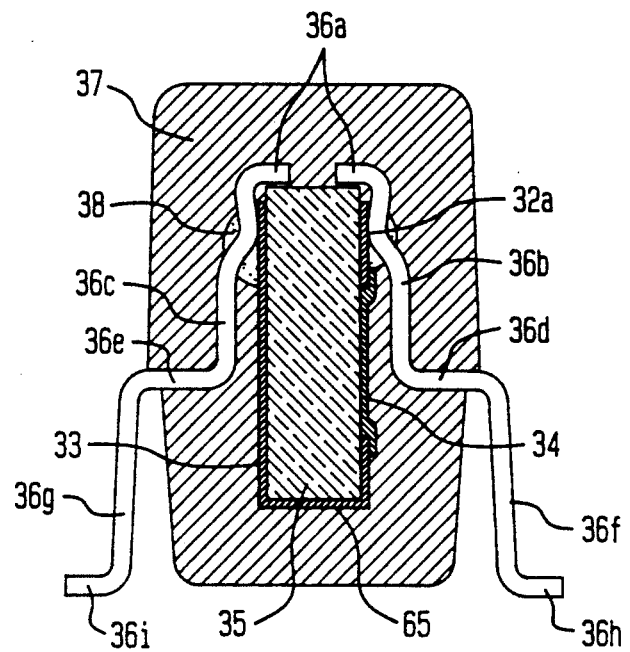
FIG. 20A to FIG. 20D are cross sectional views illustrating other modes of the third embodiment.
Figure 20B:
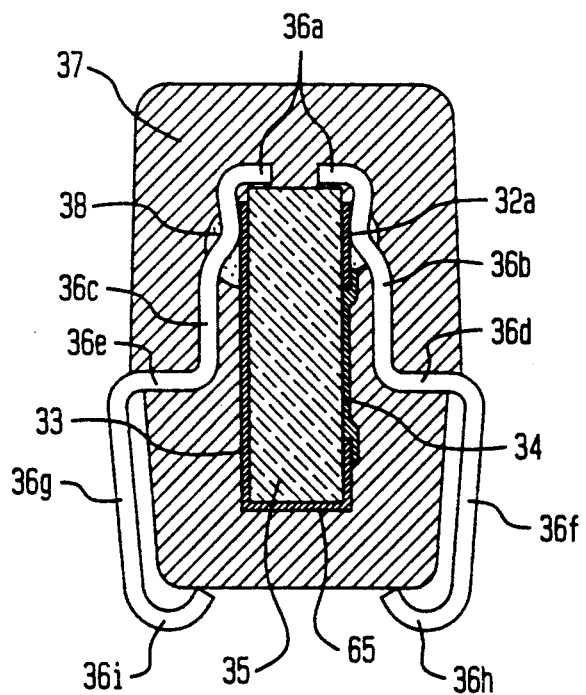

In the above embodiment, the surface-mount network device is provided with the lead terminals 36 the fifth portions 36h and 36i of which extend inwardly, but alternatively, the lead terminals 36 may be formed with the fifth portions 36h and 36i extending outwardly, as shown in FIG. 20A. Also, the fifth portions 36h and 36i of the lead terminal 36 do not necessarily have to be formed in a straight shape, but may be formed in a curved shape as shown in FIG. 20B.

Figure 20C:
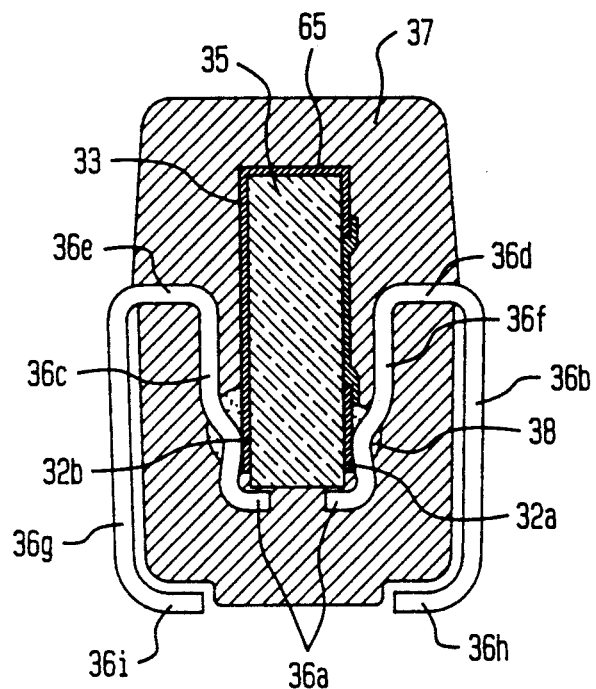
Figure 20D:
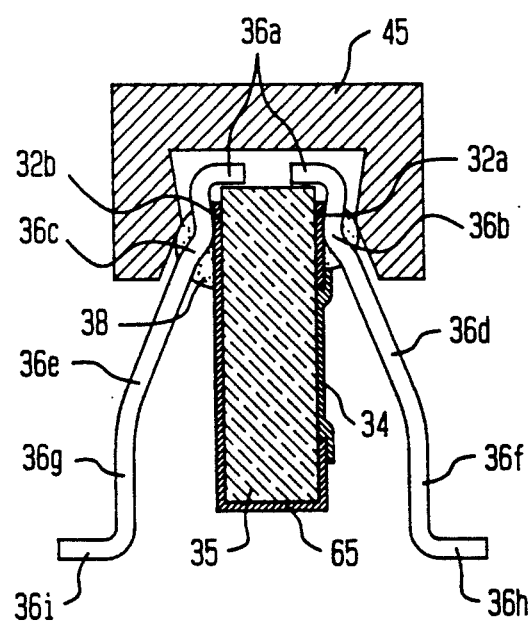

In the surface-mount network device of this embodiment, the first portion 36a of each of the lead terminals 36 extends along an end face of the insulating substrate 35, the end face being at the opposite side from the mounting surface thereof, while the second portions 36b and 36c respectively extend from the ends of the first portion 36a toward the mounting surface. However, the surface-mount network device does not necessarily have to be provided with such construction, but instead, may be so constructed, as shown in FIG. 20C, that the first portion 36a of the lead terminal 36 extends along an end face of the insulating substrate, the end face being on the mounting side, while the second portions 36b and 36c respectively extend from the ends of the first portion 36a toward the opposite end face of the insulating substrate 36. Also, the insulating substrate 35 does not necessarily have to be completely encapsulated in the molding compound 37, but may be provided, as shown in FIG. 20D, with a cap 45 on the opposite side from the mounting side thereof. With such construction, since the top surface of the network device is sufficiently flattened, it is easy to automatically mount the component on a printed circuit board using a mounter.

Figure 23A:
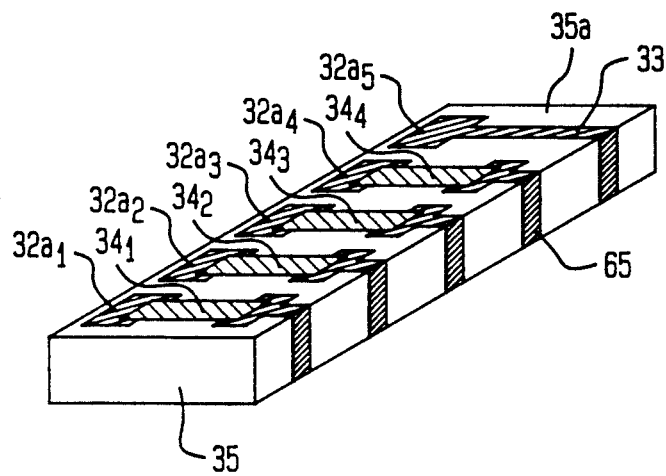
FIG. 23A is a perspective view showing a main surface of an insulating substrate of the fourth embodiment.

We will now describe a fourth embodiment of the invention. FIG. 23A shows a main surface 35a of an insulating substrate 35 of a surface-mount network device in the fourth embodiment, the other main surface thereof being indicated at 35b in FIG. 23B. As shown in FIG. 23A, there are formed on the main surface 35a of the insulating substrate 35 a circuit comprising resistors $34_1$, $34_2$, $34_3$ and $34_4$, and wirings 33 and 65, and terminal conductors $32a_1$, $32a_2$, $32a_3$, $32a_4$ and $32a_5$ for connecting the circuit to lead terminals 36. Wirings 65 are formed on an end face of the insulating substrate 35. The wirings 65 connect the circuit elements formed on the main surface 35a to circuit elements formed on the other main surface 35b.

Figure 23B:
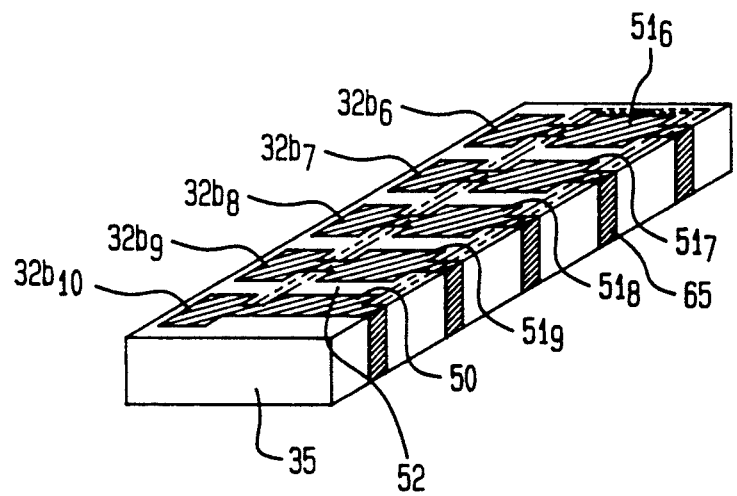
FIG. 23B is a perspective view showing another main surface of the insulating substrate of the fourth embodiment.
Figure 24:
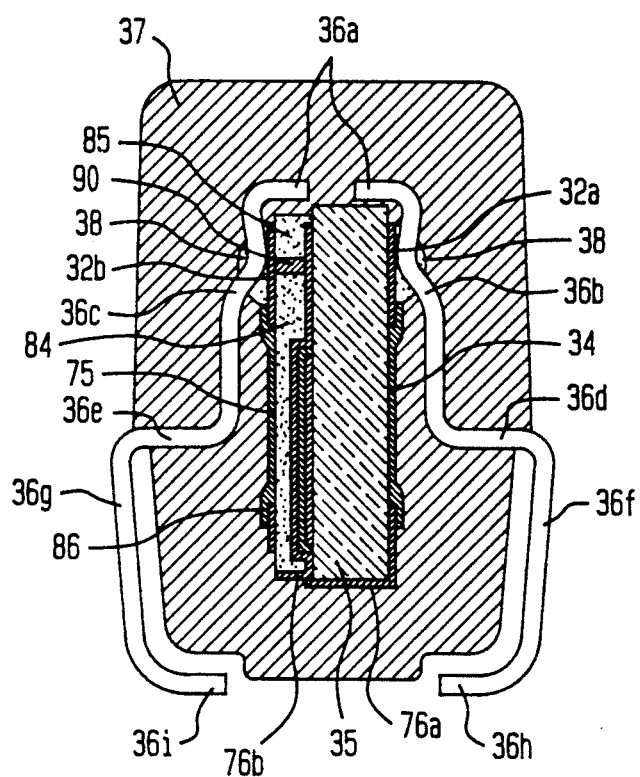
FIG. 24 is a cross sectional view of a fifth embodiment of the present invention.

FIG. 23B shows the other main surface 35b of the insulating substrate 35. As shown in FIG. 23B, there are formed on the main surface 35b a circuit comprising a capacitor's lower conductor 50, a capacitor's dielectric 52, capacitor'upper conductors $51_6$, $51_7$, $51_8$ and $51_9$, and wiring, and terminal connection conductors $32b_6$, $32b_7$, $32b_8$, $32b_9$ and $32b_{10}$ for connecting the circuit to the lead terminals 36.

Figure 21:
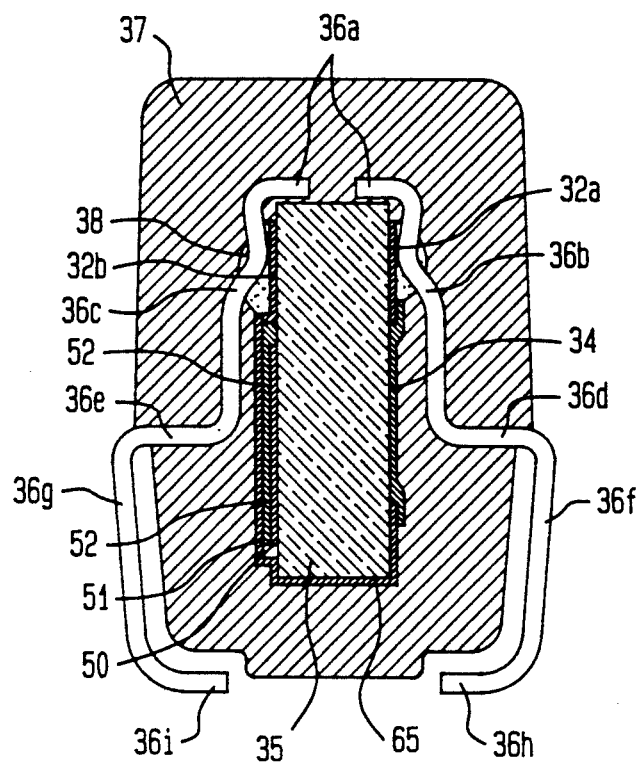
FIG. 21 is a cross sectional view of a fourth embodiment of the present invention.

FIG. 21 shows a cross section of the surface-mount network device of this embodiment. The cross sectional structure of this embodiment is essentially the same as that of the second embodiment except that the first portion of the lead terminal 36 of this embodiment is divided.

Figure 22:
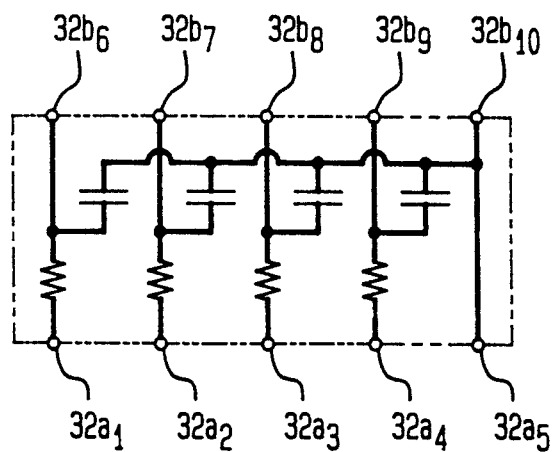
FIG. 22 is a circuit diagram showing an equivalent circuit for the fourth embodiment.

The circuits respectively formed on the main surfaces 35a and 35b of the insulating substrate 35 constitute an RC composite network device circuit. This circuit achieves, for example, integration of block A and block B of the circuit illustrated in FIG. 1. FIG. 22 shows an equivalent circuit for the network device.

In this embodiment also, since the network device is mounted so that the main surface 35a and 35b of the insulating substrate 35 are positioned perpendicular to the main surface of a printed circuit board (i.e., vertical mounting), the space taken on the printed circuit board by the network device is reduced. Also, if displacement occurs in the connections between the printed circuit board and the lead terminals 36 as a result of contraction or warpage of the printed circuit board, the lead terminals 36 having a bent shape as described above serve to alleviate the stress resulting from the displacement, thus enhancing the reliability of the soldered connections.

The materials, manufacturing method, etc., for the insulating substrate 35, resistors 34, lead terminals 36, wirings 33, etc., are the same as those for the second embodiment.

In this embodiment also, the lead terminals 36 may have the outer lead portions formed as shown in FIG. 12A, FIG. 12B or FIG. 12C.

We will now describe a surface-mount network device in a fifth embodiment of the invention. The major difference between this embodiment and the foregoing embodiments are that, in this embodiment, an insulating layer 85 is formed on the insulating substrate 35 and that a circuit is formed not only on the two main surfaces 35a and 35b of the insulating substrate 35 but also on the insulating layer 85.

Figure 26A:
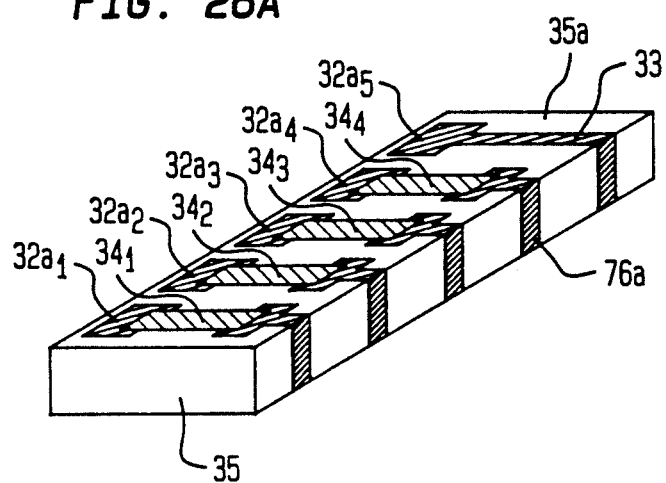
FIG. 26A is a perspective view showing a main surface of an insulating substrate of the fifth embodiment.
Figure 26B:
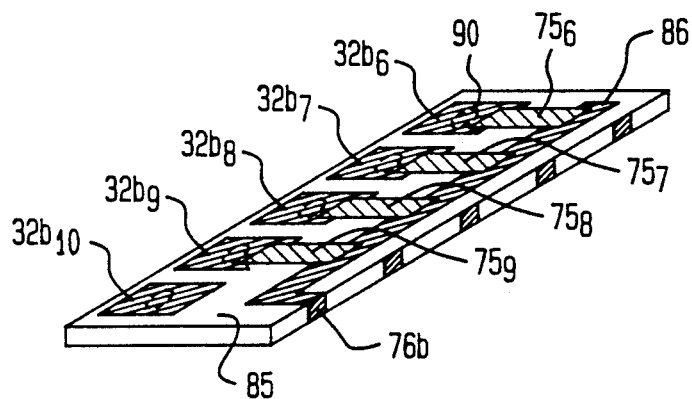
FIG. 26B is a perspective view of an insulating layer provided on the insulating substrate of the fifth embodiment.
Figure 26C:
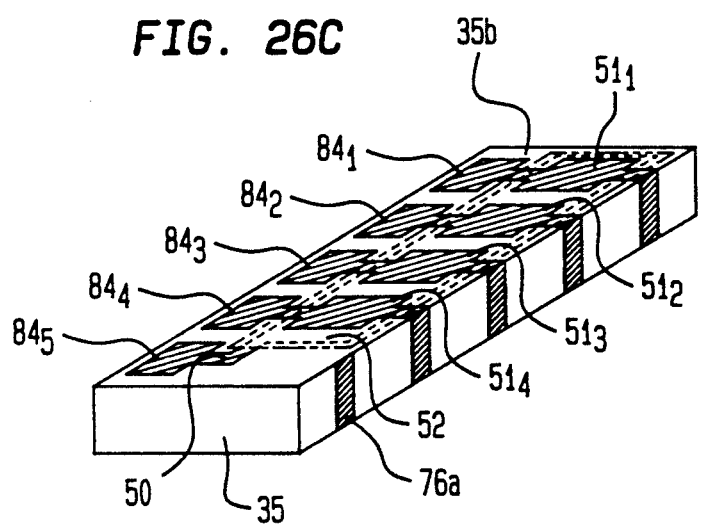
FIG. 26C is a perspective view showing another main surface of the insulating substrate of the fifth embodiment.

FIG. 26A shows a main surface 35a of an insulating substrate 35 of a surface-mount network device in the fifth embodiment of the present invention, the other main surface thereof being indicated at 35b in FIG. 26C. As shown in FIG. 26A, there are formed on the main surface 35a of the insulating substrate 35 a circuit comprising resistors $34_1$, $34_2$, $34_3$ and $34_4$, and wirings 33, and terminal connection conductors $32a_1$, $32a_2$, $32a_3$, $32a_4$ and $32a_5$ for connecting the circuit to lead terminals 36. Wirings 76a are formed on an end face of the insulating substrate 35. The wirings 76a connect the circuit elements formed on the main surface 35a to circuit elements formed on the other main surface 35b.

FIG. 26C shows the other main surface 35b of the insulating substrate 35. As shown in FIG. 26C, there are formed on the main surface 35b a circuit comprising a capacitor's lower conductor 50, a capacitor's dielectric 52, capacitor's upper conductors $51_1$–$51_4$ and conductors, and internal conductors $84_1$, $84_2$, $84_3$, $84_4$ and $84_5$ for connecting the circuit to a circuit formed on the insulating layer 85 which is hereinafter described.

The insulating layer 85 is formed on the main surface 35b of the insulating substrate 35 in such a way as to shroud the above enumerated circuit elements. In this embodiment, the insulating layer 85 is an insulating glass layer. The formation of the insulating layer 85 is accomplished by depositing thick film insulating glass paste by screen printing on the main surface 35b of the insulating substrate 35 on which capacitors are already formed, and then baking the thus deposited film. Powdered paste consisting of $PbO-B_2O_3-SiO_2$ base glass mixed with $Al_2O_3$ is desirable as the thick film insulating glass paste. The baking should be performed in an air or nitrogen atmosphere, preferably at temperatures of 800°–950° C.

FIG. 26B shows the insulating layer 85 and circuit elements formed thereon. There are formed on the insulating layer 85 a circuit comprising resistors $75_6$, $75_7$, $75_8$ and $75_9$, and a wiring 86, and terminal connection conductors $32b_6$, $32b_7$, $32b_8$, $32b_9$ and $32b_{10}$ for connecting the circuit to the lead terminals 36. The terminal connection conductors 32b are connected to the internal conductors 84 on the lower circuit (more specifically, the circuit formed on the main surface 35b of the insulating substrate 35) through vias 90 formed in the insulating layer 85. The wiring 86 is connected to the resistors $75_6$, $75_7$, $75_8$ and $75_9$, and also through conductors 76a and 76b to the terminal connection conductor $32a_5$ formed on the main surface 35a of the insulating substrate 35. The terminal connection conductor $32b_{10}$ is connected to the capacitor's lower conductor 50 through the vias 90 and the internal conductor $84_5$.

Figure 1:
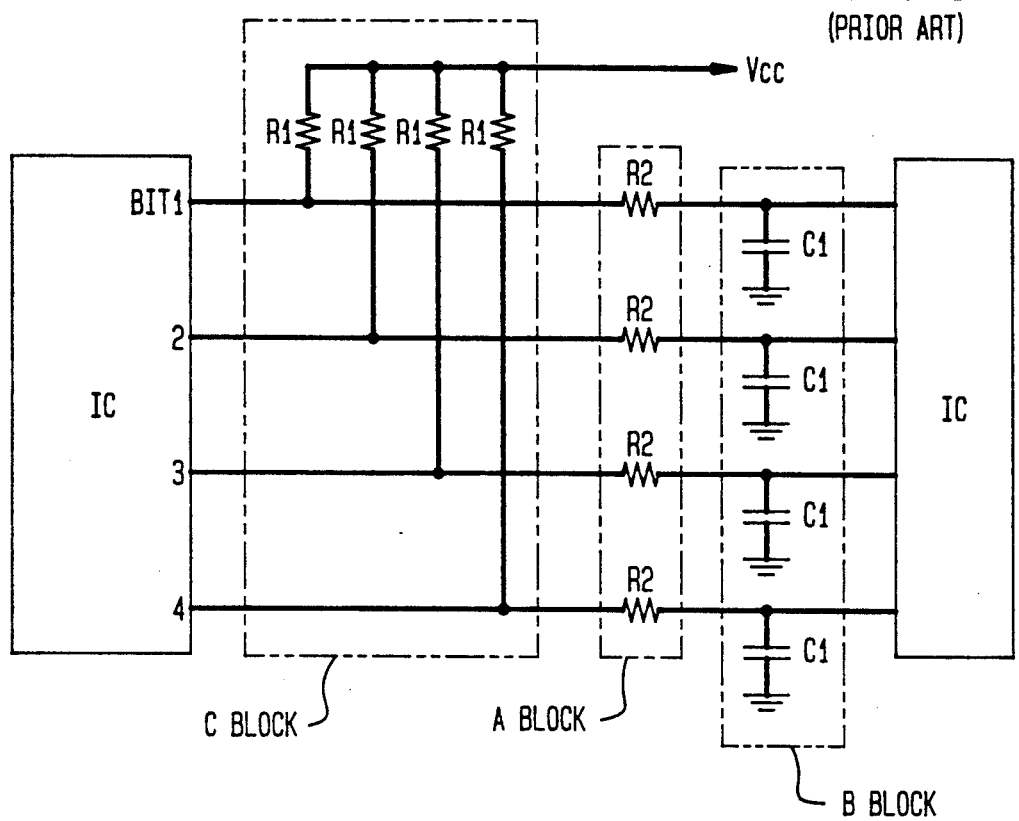
FIG. 1 is a circuit diagram showing an example of an interface passive circuit interposed between digital ICs.
Figure 2:
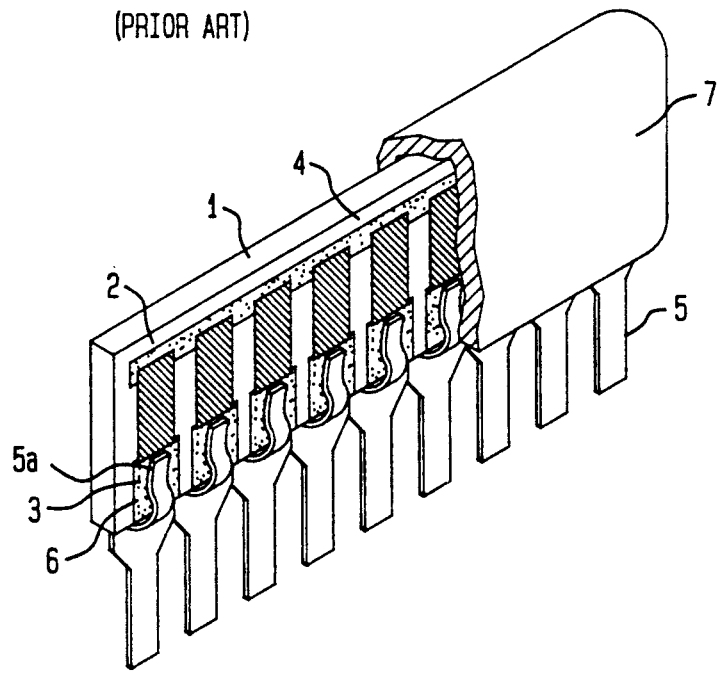
FIG. 2 is a perspective view of a SIP type resistor network device.
Figure 3A:
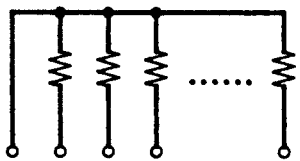
FIG. 3A to FIG. 3G are circuit diagrams showing various network device circuits.
Figure 3B:
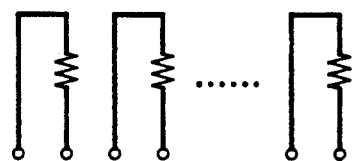
Figure 3C:
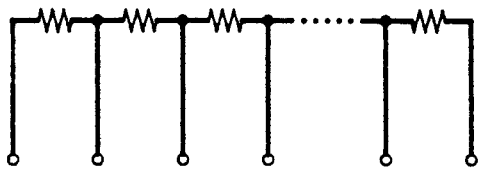
Figure 3D:
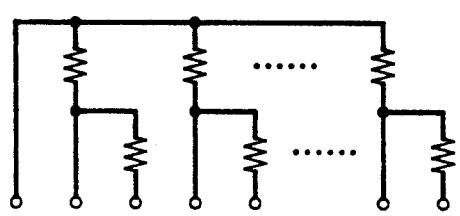
Figure 3E:
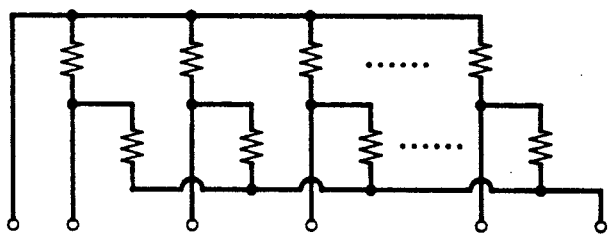
Figure 3F:
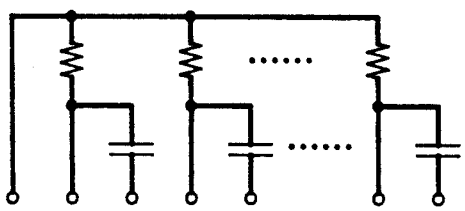
Figure 3G:
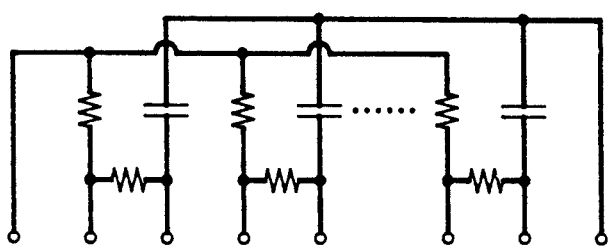
Figure 4A:
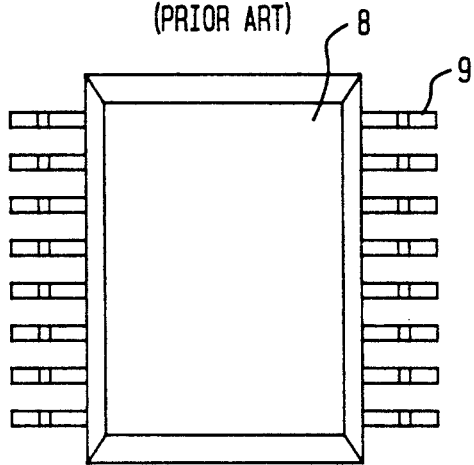
FIG. 4A is a plan view of a SOP type resistor network device.
Figure 4B:
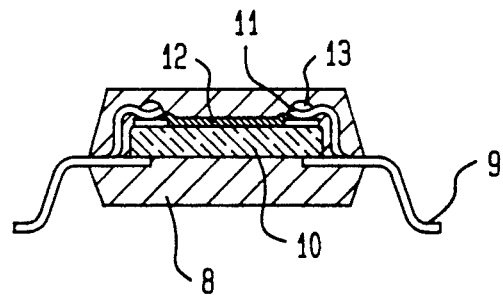
FIG. 4B is a cross sectional view of the SOP type resistor network device.
Figure 4C:
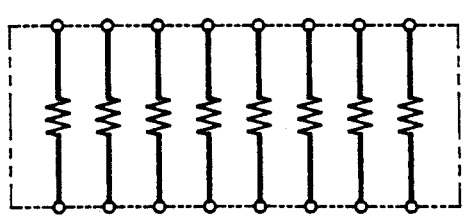
FIG. 4C is a circuit diagram showing an example of the circuit of a SOP type resistor network device.
Figure 4D:
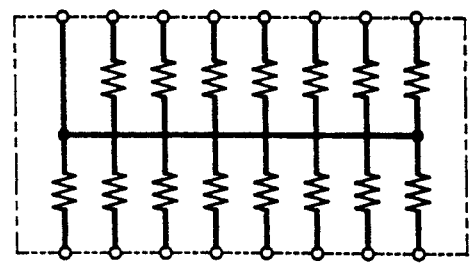
FIG. 4D is a circuit diagram showing another example of the circuit of a SOP type resistor network device.
Figures 5, 6A, 6B:
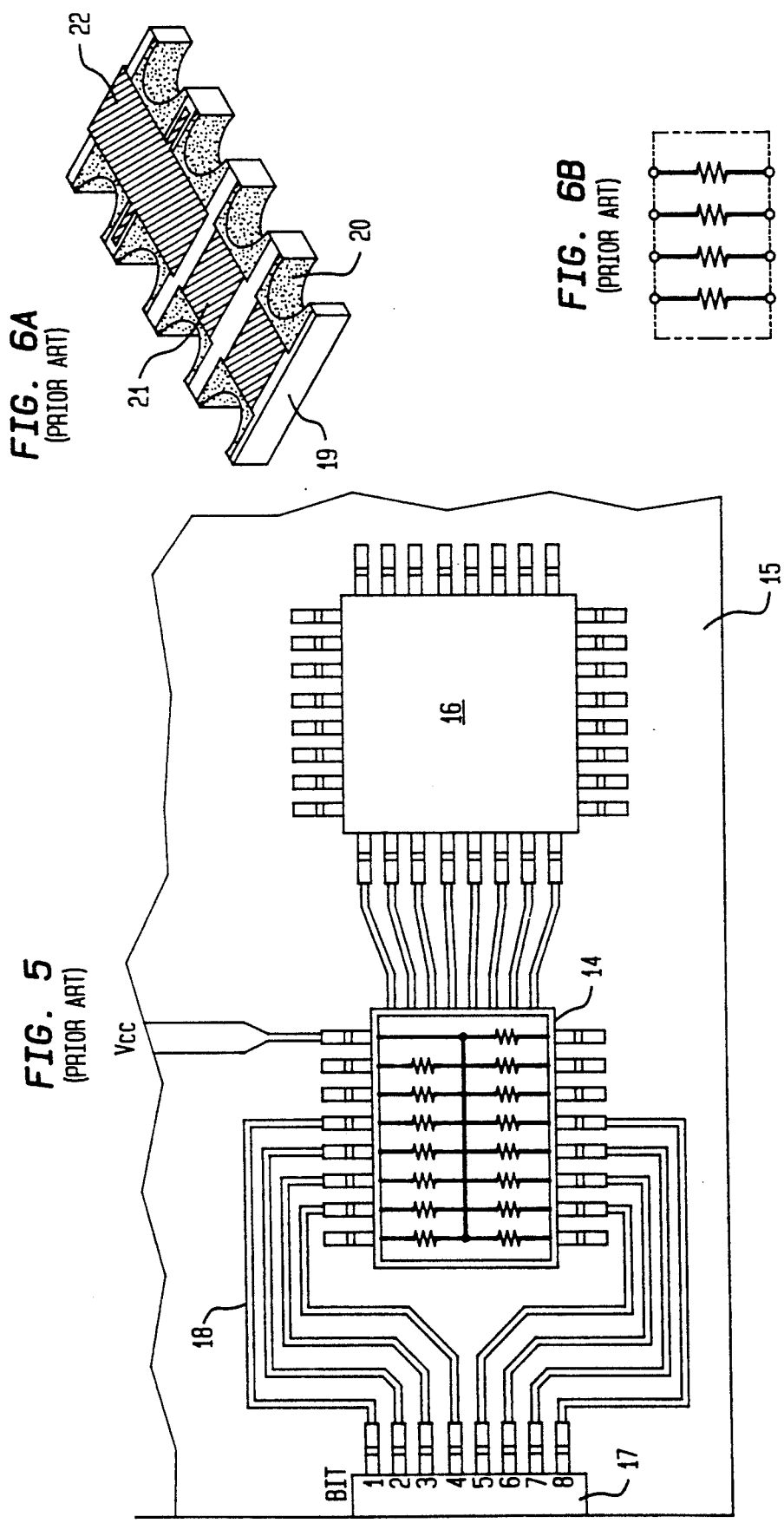
FIG. 5 is a plan view of a printed circuit board on which the SOP type resistor network device is mounted.
FIG. 6A is a perspective view of a multiple chip resistor network device.
FIG. 6B is a circuit diagram showing the circuit of the multiple chip resistor network device.
Figure 25:
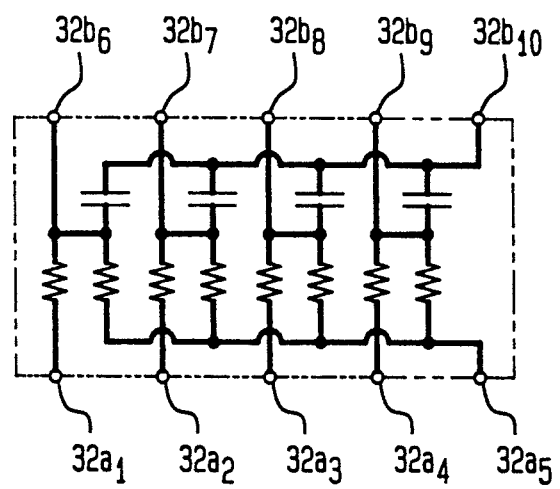
FIG. 25 is a circuit diagram showing an equivalent circuit for the fifth embodiment.

According to the above construction of this embodiment, a network device circuit combining block A, block B and block C of FIG. 1 is formed in one package. FIG. 25 shows an equivalent circuit for the network device of this embodiment.

In this embodiment also, since the network device is mounted so that the main surface 35a and 35b of the insulating substrate 35 are positioned perpendicular to the main surface of a printed circuit board (i.e., vertical mounting), the space taken on the printed circuit board by the network device is reduced. Also, if displacement occurs in the connections between the printed circuit board and the lead terminals 36 as a result of contraction or warpage of the printed circuit board, the lead terminals 36 having a bent shape as described above serve to alleviate the stress resulting from the displacement, thus enhancing the reliability of the soldered connections.

The materials, manufacturing method, etc., for the insulating substrate 35, resistors, lead terminals 36, etc., are the same as those for the other embodiments.

In this embodiment also, the lead terminals 36 may have the outer lead portions formed as shown in FIG. 20A, FIG. 20B or FIG. 20C.

As described above, the surface-mount network device of the present invention offers the following advantages:

(1) The terminal pitch is smaller than that of an insert type (through-hole type) network device.

(2) Since the network device is mounted so that the insulating substrate thereof is positioned perpendicular to the main surface of a printed circuit board, the package size is reduced as compared with conventional surface-mount network devices.

(3) High soldering reliability and high resistance to mechanical stress are achieved.

(4) Since a plurality of elements such as resistors, capacitors, etc., can be functionally integrated on the two main surfaces of the insulating substrate, complex circuitry can be achieved in one network device.

(5) Wiring layout on a printed circuit board is simplified and the space taken by the wiring on the printed circuit board is reduced.

(6) The network device can be constructed in a single in-line or a dual in-line package configuration whichever suitable. By selecting the suitable package configuration according to the circuit, it is possible to simplify the wiring layout on the printed circuit board.

It is understood that various other modifications will be apparent to and can be readily made by those skilled in the art without departing from the scope and spirit of the invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A surface-mount network device having a mounting surface which is to be mounted on a mounting substrate, said device comprising:
    an insulating substrate having at least one main surface which is substantially perpendicular to said mounting surface, at least one conductor formed on said main surface and at least one passive element formed on said main surface;
    a plurality of lead terminals which sandwich said insulating substrate, said plurality of lead terminals each having a grip portion for gripping said insulating substrate, an end portion adapted to be connected to said mounting substrate, and a middle portion between said grip portion and said end portion;
    terminal connection conductors which are formed on an end of said main surface of said insulating substrate opposite from said mounting surface, said terminal connection conductors connecting said grip portion of said lead terminals and said conductor and said passive element; and
    sealing means for covering said insulating substrate and at least connecting portions between said terminal connection conductors and said grip portion of said lead terminals,
    said end portions of said lead terminals being bent into the plane of said mounting surface, and
    said middle portions of said lead terminals extending away from said main surface of said insulating substrate, passing through said sealing means, bending outwards beyond said sealing means at about half way down said insulating substrate, and thereafter bending downwards along said main surface.

2. A surface-mount network device having a mounting surface which is to be mounted on a mounting substrate, said device comprising:
    an insulating substrate having at least one main surface, which is substantially perpendicular to said mounting surface of said device, at least one conductor formed on said main surface and at least one passive element formed on said main surface;
    a plurality of lead terminals which sandwich said insulating substrate, said plurality of lead terminals each having a grip portion for gripping said insulating substrate, an end portion adapted to be connected to said mounting substrate, and a middle portion between said grip portion and said end portion;
    terminal connection conductors which are formed on an end of said main surface near said mounting surface, said terminal connection conductors connecting said grip portion of said lead terminals and said conductor and said passive element; and
    sealing means for covering said insulating substrate and at least connecting portions between said terminal connection conductors and said grip portion of said lead terminals,
    said end portions of said lead terminals being bent into the plane of said mounting surface, and
    said middle portions of said lead terminals extending away from said main surface of said insulating substrate, passing through said sealing means, bending outwards beyond said sealing means at about half way up said insulating substrate, and thereafter bending downwards along said main surface.

3. A surface-mount network device according to claim 1 or 2 wherein each of said grip portion of said lead terminals has a substantially U-shaped portion which sandwiches said insulating substrate.

4. A surface-mount network device according to claim 3, wherein each of said end portions of said lead terminal is bent to form a substantially L-shaped portion, with said substantially L-shaped portion bent toward said main surface.

5. A surface-mount network device according to claim 3, wherein each of said end portions of said lead terminal is bent to form a gullwing-shaped portion, said gullwing-shaped portion comprising an angularly pendent substantially L-shaped portion bent away from said main surface.

6. A surface-mount network device according to claim 3, wherein each of said end portions of said lead terminal is bent to form a J-shaped portion.

7. A surface-mount network device according to claim 1 or 2 wherein each of said grip portions of said lead terminals has two approximately L-shaped portions which sandwich said insulating substrate.

8. A surface mount network device according to claim 7, wherein each of said end portions of said lead terminal is bent to form a substantially L-shaped portion, with said substantially L-shaped portion bent toward said main surface.

9. A surface-mount network device according to claim 7, wherein each of said end portions of said lead terminal is bent to form a gullwing-shaped portion, said gullwing-shaped portion comprising an angularly pendent substantially L-shaped portion bent away from said main surfaces.

10. A surface-mount network device according to claim 7, wherein each of said end portions of said lead terminal is bent to form a J-shaped portion.

* * * * *